(12) United States Patent
Uenishi

(10) Patent No.: US 8,785,308 B2
(45) Date of Patent: Jul. 22, 2014

(54) METHOD FOR MANUFACTURING SEMICONDUCTOR BASE MATERIAL

(75) Inventor: Shinji Uenishi, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/824,038

(22) PCT Filed: Sep. 12, 2011

(86) PCT No.: PCT/JP2011/005122
§ 371 (c)(1),
(2), (4) Date: Mar. 15, 2013

(87) PCT Pub. No.: WO2012/035750
PCT Pub. Date: Mar. 22, 2012

(65) Prior Publication Data
US 2013/0175568 A1    Jul. 11, 2013

(30) Foreign Application Priority Data

Sep. 17, 2010   (JP) .................................. 2010-210169

(51) Int. Cl.
*H01L 21/38*   (2006.01)

(52) U.S. Cl.
USPC .......................................... 438/551; 257/98

(58) Field of Classification Search
CPC .............. H01L 33/007; H01L 21/2018; H01L 2924/12041; H01L 33/22; H01L 21/32139; H01L 2924/12044; H01L 31/0232; H01L 2251/5361; H01L 2224/0362; H01L 2224/11622; H01L 2224/27622
USPC ........................................................ 257/98
See application file for complete search history.

(56) References Cited

U.S. PATENT DOCUMENTS

| | | | |
|---|---|---|---|
| 7,215,588 B2 * | 5/2007 | Lee | 365/222 |
| 2005/0227379 A1 * | 10/2005 | Donofrio | 438/4 |
| 2010/0196713 A1 * | 8/2010 | Usami et al. | 428/402 |
| 2011/0068351 A1 * | 3/2011 | Donofrio | 257/77 |
| 2011/0204412 A1 * | 8/2011 | Sugano | 257/103 |
| 2011/0316004 A1 * | 12/2011 | Yoon et al. | 257/79 |

FOREIGN PATENT DOCUMENTS

| | | |
|---|---|---|
| JP | 11-305416 | 11/1999 |
| JP | 2007-537581 | 12/2007 |
| JP | 2008-185908 | 8/2008 |

OTHER PUBLICATIONS

International Search Report for PCT/JP2011/005122, filed Nov. 15, 2011.

* cited by examiner

*Primary Examiner* — Bilkis Jahan
(74) *Attorney, Agent, or Firm* — Nixon & Vanderhye, P.C.

(57) ABSTRACT

In forming an etching mask for forming a repetitive concave-convex pattern on a surface of a substrate of a semiconductor base material by exposure development of a resist film, the present invention prevents a development pattern from being deformed due to excessive exposure on a part where exposure regions are adjacent to each other in the resist film by repetitive exposure. In a method for manufacturing a semiconductor base material, when forming an etching mask for forming a concave-convex portion on a surface of the semiconductor base material, by a photolithography process of the resist film, a transfer mask is used, as a transfer mask 100, which is obtained by previously correcting the size of a dotted light shielding section 104 which is an exposure pattern near a region on which exposure shots overlap.

12 Claims, 9 Drawing Sheets

(a)

(b)

METHOD FOR MANUFACTURING SEMICONDUCTOR BASE MATERIAL

This application is the U.S. national phase of International Application No. PCT/JP2011/005122 filed 12 Sep. 2011 which designated the U.S. and claims priority to JP Patent Application No. 2010-210169 filed 17 Sep. 2010, the entire contents of each of which are hereby incorporated by reference.

TECHNICAL FIELD

The present invention relates to: a method for manufacturing a semiconductor base material; a semiconductor apparatus; and an electrical device. More particularly, the present invention relates to: a method for processing a semiconductor base material, which constitutes a semiconductor apparatus such as a light-emitting element, to form a surface shape of the substrate into a concave-convex shape so that light can be efficiently taken from the light-emitting element; a semiconductor apparatus with a semiconductor base material obtained by the method; and an electrical device equipped with the semiconductor apparatus.

BACKGROUND ART

Semiconductor apparatuses conventionally include light-emitting elements, such as light-emitting diodes and semiconductor lasers.

FIG. 5(a) is a diagram conceptually showing a structure of a light-emitting diode, as an example of a conventional semiconductor apparatus.

As shown in FIG. 5(a), a conventional semiconductor apparatus, such as a light-emitting diode (LED) 220, fundamentally has a laminated structure in which an n-type semiconductor layer 222, an active layer 223, and a p-type semiconductor layer 224 are laminated in order on a substrate 221. A p-type electrode and an n-type electrode (not shown) are formed on a p-type semiconductor layer and an n-type semiconductor layer respectively.

To a light-emitting diode of such a structure, a device structure is applied for taking light generated in a light emitting region with an active layer, from a surface on which an electrode is formed (front surface of the laminated structure), or from a substrate surface which will not grow a semiconductor layer (back or side surface of the laminated structure), in the laminated structure, the generation of light being performed by recombination of a hole introduced from the p-type semiconductor layer 224 to the active layer 223, and an electron from the n-type semiconductor layer 222 to the active layer 223.

In the light-emitting diode, by controlling of the laminated structure at an atomic level, the flatness of the substrate is processed to the level of a mirror surface. Thus, the semiconductor layer, light emitting region and electrode on the substrate are arranged in parallel with one another. Furthermore, the refractive index of the semiconductor layer is greater than the refractive index of the substrate or the electrode (transparent electrode). Thus, a waveguide is formed between the front surface of the p-type semiconductor layer 224 and the front surface of the substrate 221. That is, the waveguide is formed by the structure of the semiconductor layer with a greater refractive index interposed between the substrate and the transparent electrode, which have a smaller refractive index. This waveguide is inserted between the interface of the p-type semiconductor layer and the electrode, and the interface of the substrate and the electrode.

Thus, when light L generated from the active layer enters the surface of the electrode or the surface of the substrate at an angle equal to or greater than a predetermined critical angle, the light L will be reflected from the interface of the electrode and the p-type semiconductor layer 224, or from the front surface of the substrate 221. The light L will then propagate laterally in the laminated structure of the semiconductor layer and will be trapped in the waveguide. Furthermore, the light L will also be lost during the propagation in the lateral direction. As a result, a desired external quantum efficiency (i.e., efficiency to retrieve the light generated within the light-emitting diode, to the outside) cannot be attained. In other words, the light which enters the interface to the substrate or electrode at an angle greater than the critical angle will propagate through the waveguide by repeating total reflection, and the light will be absorbed during the reflection. Because of this, part of the generated light will be attenuated and such light cannot be effectively taken to the outside, resulting in reduced external quantum efficiency.

To cope with such a problem, a method is proposed for forming a concave-convex section on a front surface of a substrate to scatter light generated in a light emitting region, thus improving an external quantum efficiency (see Patent Document 1).

FIG. 6 is a diagram for describing a semiconductor light-emitting element (GaN system LED) disclosed in Patent Document 1. FIG. 6 shows a cross-sectional view of the semiconductor light-emitting element having a substrate with an uneven front surface.

A light-emitting element 210 comprises, as an insulating substrate, a sapphire substrate 211, surface of which is made in a concave-convex shape by forming a plurality of convex sections 211a on the surface. The light-emitting element 210 has a laminated structure obtained by laminating an n-type GaN layer 212, an active layer 213, and a p-type GaN layer 214, on the substrate 211. In the laminated structure, an n-type electrode 217 is formed on an exposed surface of the n-type GaN layer 212, and a p-type electrode (transparent electrode) 216 is formed on the p-type GaN layer 214 with a p-type contact layer 215 interposed therebetween. Furthermore, the entire surface of the light-emitting element is covered by a protection film 218, except for connection sections of electrodes of respective conductivity types, the connection section being connected with wirings.

Next, a manufacturing method will be described.

First, a resist film is patterned on a front surface of the sapphire substrate 211, using a photomask (exposure mask), to form an etching mask. The surface of the sapphire substrate 211 is selectively etched by RIE (reactive ion etching) using an etching mask to form a concave-convex section 211b. At this step, through the patterning of a resist film using the photomask, the exposure process of a resist film is repeatedly performed while moving a wafer stage with a sapphire substrate 211 placed thereon at a constant pitch, thereby forming a repeated pattern on the resist film for forming a concave-convex section on a surface of the sapphire substrate.

Thereafter, an AlN layer (not shown) is formed as a buffer layer, on the sapphire substrate 211 using a sputtering apparatus. An n-type GaN layer 212, an active layer 213, and a p-type GaN layer 214 are successively allowed to grow on the AlN layer, using a MOCVD apparatus.

Furthermore, a p-type electrode 216 is formed, as a transparent electrode, on the p-type GaN layer 214 with a contact layer 215 interposed therebetween. After selective etching of the semiconductor layer on the n-type GaN layer 212 in such a manner to allow part of the surface of the n-type GaN layer 212 to be exposed, an n-type electrode 217 is formed on an exposed surface of the n-type GaN layer 212.

With the light-emitting element 210 having such a structure, its external quantum efficiency is dramatically improved as shown in FIG. 5(b), compared to the light-emitting element 220 (FIG. 5 (a)) with a conventional flat substrate 221.

That is, in the light-emitting element 210 disclosed in FIG. 6, the light L, which laterally propagates in the light-emitting element 220 (FIG. 5(a)) with the conventional flat substrate 221, will be scattered or diffracted at the concave-convex section 211b, and the light generated in the laminated structure of the semiconductor element will be effectively taken from the front surface of the upper semiconductor layer in the laminated structure, or from the back surface of the substrate in the lower part of the laminated structure. As a result, external quantum efficiency can be dramatically improved.

Specifically, first, light flux increases towards the upper side or the lower side with respect to the surface of the substrate by the scattering and diffracting effect of light by the concave-convex section on the surface of the substrate, thereby increasing the luminance of the light emitting surface of the light-emitting element when the light emitting surface is observed from the front (=front luminance). Second, using the scattering and diffracting effect of light by the concave-convex section on the surface of the substrate, the light laterally propagating through the semiconductor layer is decreased, thereby reducing the loss of the light due to absorption during the propagation and increasing the total amount of the light emission.

PRIOR ART DOCUMENT

Patent Document

Patent Document 1: Japanese Laid-Open Publication No. 2008-10894

SUMMARY OF INVENTION

Problems to be Solved by the Invention

However, it is necessary to control the concave-convex shape formed on the front surface of the substrate in an accurate manner. If the controlling of the concave-convex shape is not sufficient, then it will not be possible to form a semiconductor layer in a favorable manner on the substrate with the concave-convex shape formed thereon. For example, the concave-convex structure on the surface of the substrate is a microstructure. Thus, if a GaN layer is allowed to grow on the substrate, in a state where concave and convex sections are formed with insufficient accuracy on the surface of the substrate, then it will not be possible to fill the periphery of the concave and convex sections of the concave-convex structure completely with the GaN layer, causing pits and voids.

Due to the occurrence of such voids, cracks tend to occur at the re-growth of the GaN, that is, upon forming the GaN layer of the upper layer after the GaN layer of the lower layer is formed. This will reduce the crystallinity of the GaN in the semiconductor element. Accordingly, luminous efficiency (i.e., internal quantum efficiency, which means an efficiency at which the light generates inside the light-emitting element) will be reduced, resulting in the further reduction of the external quantum efficiency, which is the efficiency at which the light is taken out from the light-emitting element. Furthermore, due to the occurrence of cracks in the semiconductor layer constituting the light-emitting element, the reliability of the light-emitting element will also be decreased.

The reduction in the crystallinity of semiconductors due to the occurrence of cracks also applies to other semiconductor apparatuses, such as a light receiving element and an electronic device, in addition to a light-emitting diode and other light-emitting elements.

Furthermore, poor formation of the concave section and convex section may result in problems of, in addition to the occurrence of voids, causing poor growth of a semiconductor layer to cause crystal defects, such as threading dislocation, in the semiconductor layer, and causing an abnormally grown region on a wafer surface.

It should be noted that the step of forming a concave-convex section on the front surface of the substrate comprises a step of forming a resist pattern used as an etching mask for the selective etching of the substrate, as described above. This step of forming a resist pattern comprises an exposure step of repeatedly performing exposure on a resist film while moving a wafer stage with the substrate placed thereon at a constant pitch with respect to a transfer mask (hereinafter, also referred to as exposure mask). there is a problem, in the exposure step, due to multiple exposure at a boarder portion of adjacent exposure regions, of poor formation of a resist pattern for forming a concave-convex section on the surface of the substrate, the resist pattern being obtained after the development of the multiple-exposure regions and the nearby regions thereof, in a resist film, the poor formation causing the generation of pits and voids in the subsequent GaN growth.

Hereinafter, a more detailed description will be provided with reference to FIGS. 7 to 9.

FIG. 7 is a chart for showing a flow of a photolithography process for forming a concave-convex resist pattern on a sapphire substrate of a light-emitting element (LED). FIG. 8 is a diagram for describing an exposure process in the photolithography process shown in FIG. 7. FIG. 8 (a) shows a transfer mask (exposure mask), and FIG. 8 (b) shows an adjacent exposure region. FIG. 9 is a diagram for showing a process to form a concave-convex section on a sapphire substrate in the order of the steps (FIGS. 9(a) to 9(f)).

First, as shown in FIG. 9(a), a photoresist of a desired film thickness is applied to sapphire substrate 211 to form a resist film 212 (process P1). For the resist used in this application, a positive type photoresist with excellent anti-dry etching property is used because RIE is used for etching.

Thereafter, as shown in FIG. 9(b), a process of exposing the resist film 212 with UV light is repeatedly performed using a transfer mask (exposure mask) 200 prepared beforehand at a preparation step (process P2a), while moving a wafer stage S with the sapphire substrate 211 placed thereon with respect to the exposure mask 200 (process P2). Then, as shown in FIG. 9(c), the resist film 212 is developed to form a resist mask 212a (process P3).

Thereafter, the substrate 211 is etched by RIE, with the resist mask 212a used as an etching mask, to form a concave-convex section 211b, which is formed due to a plurality of convex section 211a, on the surface of the substrate (process P4).

Thereafter, an AlN film 213 is formed, as a buffer layer, on the surface of the substrate (FIG. 9(e)), and then undoped GaN layers 214a to 214c are formed on the AlN film 213. Thereabove, an n-type GaN layer 215 is further formed to complete semiconductor base material (LED template) used to form a light-emitting diode (FIG. 9 (f)). The lower, undoped GaN layer 214a is formed by selective epitaxial growth in a concave section of the surface of the substrate. The middle, undoped GaN layer 214b is formed by selective and lateral epitaxial growth from the side surface of the lower, undoped GaN layer 214a, on the lower undoped GaN layer 214a and the convex section of the substrate, in such a manner to bury the lower, undoped GaN layer 214a. The upper, undoped GaN layer 214c is formed on the middle, undoped GaN layer 214b by epitaxial growth.

The exposure mask 200 used herein is obtained by forming a light shielding film (e.g., chromium film) having a predetermined pattern on a translucent substrate, such as a glass substrate. As shown in FIG. 8(a), the exposure mask 200 comprises; a light shielding section 201 in the periphery of the mask; a circular light shielding section 203 corresponding to the convex section formed on the substrate; and a light transmissive section 202 corresponding to the concave section formed on the substrate.

As shown in FIG. 8(b), exposure regions 207a and 207b are formed adjacent to each other in the resist film 212 on which exposure has been conducted repeatedly using the exposure mask. Near a linking portion 205 of the exposure regions, the shape of a light shielding section corresponding region 206 is deformed due to excessive exposure, while the region 206 is supposed to be in a circular shape corresponding to the convex section on the surface of the substrate.

For the UV exposure, a reduced projection type apparatus with excellent processing accuracy is used since the size of the subject concave-convex pattern, e.g., the diameter of the circular light shielding section, is as fine as 0.5 μm to 10 μm and thus the size variation after the photolithography process needs to be reduced. For the exposure on the entire substrate, the reduced projection type apparatus is equipped with a step and repeat function in the wafer stage on which the substrate is placed. The step and repeat function is such a function to move the substrate placed on the wafer stage, by the distance corresponding to each exposure region to transfer the exposure pattern of the transfer mask onto each exposure region.

The exposure region (drawing region) of the transfer mask shown in FIG. 8 (a) is generally several square millimeters to 40 square millimeters in size. By repetitive exposure, the exposure pattern corresponding to the concave-convex section on the surface of the substrate is formed on the entire substrate. Note that the exposure region (drawing region) is a region surrounded by the light shielding section 201 in the periphery of the mask.

Since a positive type photoresist is used, there may be a portion on which no exposure is performed between exposure shots due to the variation in the movement of the wafer stage. Thus, an exposure shot needs to be formed with a part thereof overlapping a part of another exposure shot.

However, as shown in FIG. 8 (b), a multiply-exposed portion 205 will be consequently made in a region linking the exposure shots (exposure regions) 207a and 207b. As a result, the region where exposures overlap and the concave-convex resist pattern nearby will be a poorly exposed section 206 due to excessive exposure energy. This will be a cause of generating pits or voids in the latter GaN growth.

The reduced projection type exposure apparatus has also been used for the manufacture of LSI. In the manufacture of LSI, a scribe line is present between chips, and chips are diced along the line. Thus, the lining part of exposure shots can be overlapped with a scribe line so that there will be no device problem of poor pattern formation in the subject region. With regard to semiconductor base materials used for light-emitting elements, however, the region, on which a light-emitting element is arranged to be a chip, does not correspond to the exposure region for forming a concave-convex section on the substrate of the semiconductor base material. It comes near to stating the obvious that the linking part of the exposure region for forming a concave-convex section on the base material, cannot be aligned with the scribe line for making a wafer into chips.

The present invention is intended to solve the conventional problems described above. It is an objective of the present invention to provide a method for manufacturing a semiconductor base material, the method capable of preventing a development pattern from being deformed, in forming an etching mask for forming a repeating concave-convex pattern on a front surface of a substrate of a semiconductor element by exposure development of a resist film, due to excessive exposure on a part where the exposure regions are adjacent to each other in the resist film by repetitive exposure to the resist film, thus manufacturing a semiconductor base material that favorably allows a semiconductor layer to grow, as a semiconductor base material including a substrate with concave-convex sections repeatedly formed on a surface thereof; a semiconductor apparatus with a semiconductor base material obtained by the method; and an electrical device equipped with the semiconductor apparatus.

Means for Solving the Problem

A method for manufacturing a semiconductor base material according to the present invention by processing a substrate so that a surface of the substrate has a concave-convex structure, and epitaxially growing a semiconductor layer above the substrate so that the concave-convex structure is buried, is provided, the method comprising: a step of forming a resist mask on the surface of the substrate by a photolithography process; and a step of selectively etching the substrate using the resist mask to form the concave-convex structure on the surface of the substrate, wherein the step of forming the resist mask comprises an exposure step of repeatedly performing a process of transferring an exposure pattern formed on a transfer mask, onto a resist film formed on the substrate, for each exposure region corresponding to the transfer mask, and wherein the transfer mask is obtained by correcting the size of a light shielding pattern positioned in a corresponding manner near a multiple exposure section where the exposure of light to adjacent exposure regions overlap with each other on the resist film, based on an increase in an exposure amount due to multiple exposure, thereby achieving the objective described above.

Preferably, in a method for manufacturing a semiconductor base material according to the present invention, the step of epitaxially growing the semiconductor layer on the substrate comprises a step of selectively growing a semiconductor layer on the substrate in a lateral direction so that the concave-convex structure of the substrate is buried.

Still preferably, in a method for manufacturing a semiconductor base material according to the present invention, the process of etching the substrate is a dry etching process.

Still preferably, in a method for manufacturing a semiconductor base material according to the present invention, the exposure is UV exposure.

Still preferably, in a method for manufacturing a semiconductor base material according to the present invention, a reduced projection type exposure apparatus, equipped with a step and repeat function in a stage on which the substrate is placed, is used for the UV exposure, and the step and repeat function is to move the substrate placed on the stage by a distance corresponding to each exposure region to transfer a light shielding pattern of the transfer mask to each exposure region.

Still preferably, in a method for manufacturing a semiconductor base material according to the present invention, the resist film formed on the substrate is formed by applying a positive type photoresist to the substrate.

Still preferably, in a method for manufacturing a semiconductor base material according to the present invention, a correction amount for correcting the size of the light shielding pattern is determined by calculating the size of a resist pattern corresponding to the light shielding pattern, after the photolithography processing, and with an integrated dose energy of exposure light in the multiple exposure section as a parameter.

Still preferably, in a method for manufacturing a semiconductor base material according to the present invention, the transfer mask comprises a transparent substrate and a light shielding film having a predetermined open pattern, the light shielding film being formed on the transparent substrate, and the light shielding pattern is a planar pattern of the light shielding film.

Still preferably, in a method for manufacturing a semiconductor base material according to the present invention, the light shielding pattern of the light shielding film formed on the transfer mask is a dotted light shielding pattern.

Still preferably, in a method for manufacturing a semiconductor base material according to the present invention, the dotted light shielding pattern corresponding to an uncorrected light shielding pattern on the transfer mask, has a planar and circular shape of a diameter ranging from 0.5 μm to 10 μm, and the dotted light shielding pattern corresponding to a corrected light shielding pattern on the transfer mask, is positioned at a peripheral portion of the transfer mask, and has a shape in which the planar and circular shape of the diameter ranging from 0.5 μm to 10 μm is extended toward the outside the transfer mask.

Still preferably, in a method for manufacturing a semiconductor base material according to the present invention, the light shielding pattern of the light shielding film formed on the transfer mask is a striped light shielding pattern.

Still preferably, in a method for manufacturing a semiconductor base material according to the present invention, the striped light shielding pattern corresponding to an uncorrected light shielding pattern on the transfer mask, has a planar belt-like shape with a stripe width ranging from 0.5 μm to 10 μm, and the striped light shielding pattern corresponding to a corrected light shielding pattern on the transfer mask, is positioned at a peripheral portion of the transfer mask, and has a shape in which the planar belt-like shape with a stripe width ranging from 0.5 μm to 10 μm is extended toward the outside of the transfer mask.

A semiconductor apparatus according to the present invention is obtained by forming a semiconductor element on a semiconductor base material, wherein the semiconductor base material is the semiconductor base material obtained by the method for manufacturing a semiconductor base material according to the present invention, thereby achieving the objective described above.

An electric device according to the present invention comprises a semiconductor apparatus, wherein the semiconductor apparatus is the semiconductor apparatus according to the present invention, thereby achieving the objective described above.

Next, the working effects of the present invention will be described.

In the present invention, upon repeatedly transferring a light shielding pattern, corresponding to a concave-convex section to be formed on a front surface region of a substrate, on a resist film throughout the entire substrate while moving an exposure mask, a transfer mask with a corrected layout of a light shielding pattern is used in accordance with integrated exposure energy of overlapping exposure regions, in order to prevent deformation of overlapping exposure regions and a nearby resist pattern in a resist mask. As a result, the concave-convex patterning can be performed with high accuracy on the surface of the substrate, thereby preventing external quantum efficiency from being reduced, and thereby improving the reliability of the semiconductor element.

Furthermore, in the present invention, the light shielding pattern of the transfer mask (exposure mask) is simply adjusted so that a mask pattern of a resist mask after development will have a predetermined pattern, in accordance with the increase of the amount of exposure near the boarder of adjacent exposure regions on the substrate. Thus, the present invention is capable of preventing the manufacture cost from increasing without adding additional manufacturing step upon concave-convex photolithography processing or dry etching.

Effects of Invention

According to the present invention, in forming an etching mask for forming a concave-convex section on a front surface of a substrate by photolithography processing of a resist film, deformation of a resist pattern can be avoided in exposure regions which are adjacent to each other in a resist film. Accordingly, the resist film can be processed with high accuracy during photolithography processing. As a result, an etching mask can be accurately formed on the substrate. Thereby, the present invention prevents an external quantum efficiency of a light-emitting element from being reduced, the light-emitting element having a substrate, the front surface of which is processed in a concave-convex shape by using the etching mask. Furthermore, the present invention improves the reliability of the light-emitting element as a semiconductor element.

Furthermore, in the present invention, the light shielding pattern of the exposure mask is simply adjusted so that a mask pattern of a resist mask after development will have a predetermined pattern, based on the increasing amount of exposure due to multiple exposure near the boarder of adjacent exposure regions on the substrate. Thus, the present invention is also capable of obtaining an effect of reducing the manufacture cost without adding any additional processes to a photolithography process or to a dry etching process.

BRIEF DESCRIPTION OF THE DRAWINGS

FIG. 1 (a) shows a cross sectional view of the insulating substrate, and FIG. 1 (b) shows a shape of a surface of the insulating substrate.

FIG. 8(a) shows an exposure mask, and FIG. 8(b) shows adjacent exposure regions.

DESCRIPTION OF THE PREFERRED EMBODIMENTS

Hereinafter, an embodiment of the present invention will be described in detail with reference to the accompanying figures.

Embodiment 1

Figure 1:
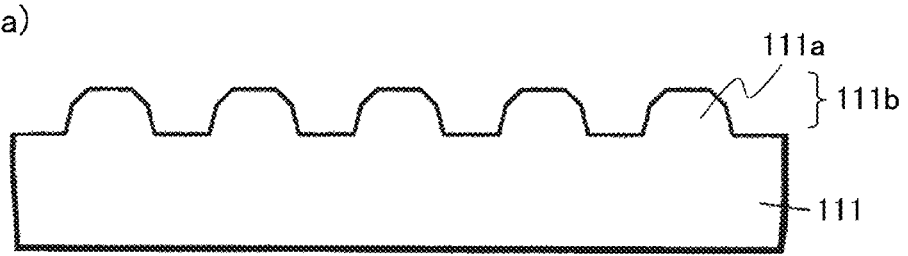
FIG. 1 is a diagram for describing an insulating substrate comprised in a semiconductor base material obtained by a method for manufacturing a semiconductor base material according to Embodiment 1 of the present invention.
Figure 1:
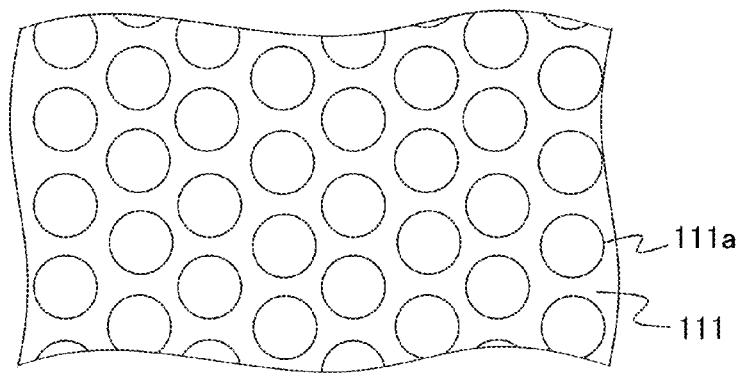

FIG. 1 is a diagram for describing a substrate comprised in a semiconductor base material obtained by a method for manufacturing a semiconductor base material according to Embodiment 1 of the present invention. FIG. 1(a) shows a cross sectional view of the substrate, and FIG. 1(b) shows a shape of a surface of the substrate.

A substrate 111 shown in FIG. 1 is an insulating substrate of sapphire or the like. Convex sections 111a, having a predetermined planar shape and cross-sectional shape, are regularly arranged on the surface of the substrate 111, and the plurality of convex sections 111a form a concave-convex section 111b on the surface of the substrate. Herein, the plurality of convex sections 111a are arranged in such a manner that the arrangement of the convex sections 111a is shifted in an adjacent column by half an arrangement pitch of the convex sections in a column.

Figure 2:
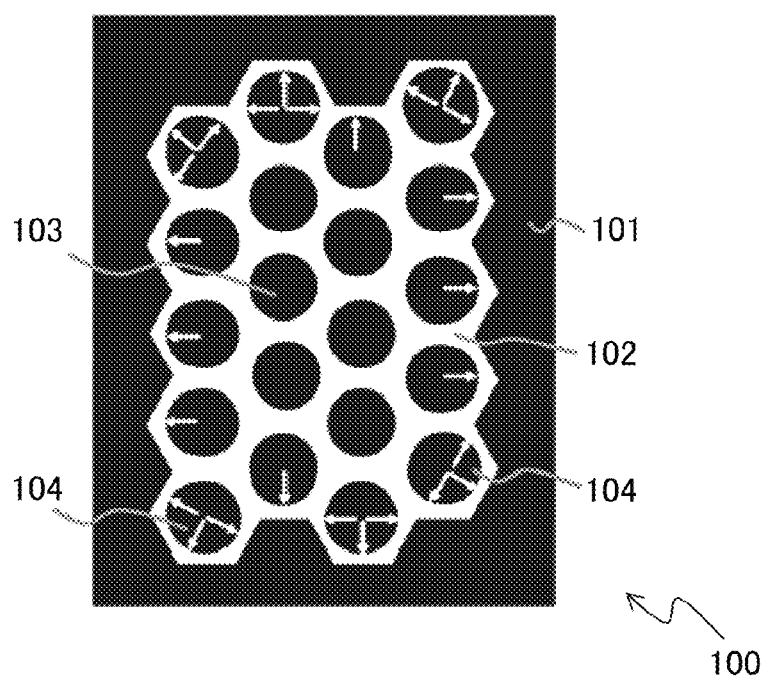
FIG. 2 is a planar view for describing an exposure mask (transfer mask) used in a method for manufacturing a semiconductor base material according to Embodiment 1 of the present invention.

FIG. 2 is a planar view for describing an exposure mask (transfer mask) used in a method for manufacturing a semiconductor base material according to Embodiment 1 of the present invention.

A transfer mask 100 shown in FIG. 2 is obtained by selectively forming a metallic film, such as chrome, as a light shielding film on a surface of a light transmissive substrate, such as a glass substrate, similar to the transfer mask 200 used in the conventional method for manufacturing a semiconductor base material. In Embodiment 1, the transfer mask is configured such that a planar pattern (in other words, light shielding pattern) of the light shielding film in a pattern transferring region of the transfer mask is corrected in accordance with exposure energy in a multiple exposure portion, exposure regions corresponding to a pattern transfer region of the transfer mask being adjacent to each other, in a resist film.

Specifically, the transfer mask 100 comprises: a peripheral light shielding section 101 formed in a peripheral part of the mask in such a manner to surround the pattern transfer region; circular shaped, dotted light shielding sections 103 and 104, a plurality of the dotted light shielding sections being are arranged within the pattern transfer region and the dotted light shielding sections being formed to correspond to convex sections to be formed on a substrate; a light transmissive section 102, which is a remaining part other than the dotted light shielding section within the pattern transfer region.

The dotted light shielding section 103 is arranged at the middle part of the pattern transfer region of the transfer mask, and the dotted light shielding section 104 is arranged in the periphery of the pattern transfer region of the transfer mask.

In the method for manufacturing a semiconductor base material in the present Embodiment, the reduced projection type apparatus used is similar to the one described with regard to the prior art. That is, the size of the applied concave-convex pattern, such as the diameter of the circular light shielding section, is as fine as 0.5 μm to 10 μm, and the variation in size after the photolithography processing needs to be reduced. Thus, a reduced projection type apparatus with excellent processing accuracy is used for the UV exposure in the present Embodiment. This reduced projection type apparatus is equipped with a step and repeat function in the wafer stage on which a substrate is placed, in order to perform exposure on the entire substrate (entire wafer). The step and repeat function is such a function to move the substrate placed on the wafer stage, by the distance corresponding to each exposure region to transfer the exposure pattern of the transfer mask onto each exposure region. The diameter (0.5 μm to 10 μm) of the circular, light shielding section (dotted light shielding pattern) is based on the following points. First, when the diameter of the dotted convex section is as small as, or smaller than, several μm, the scattering and diffracting effect of light begins to appear due to the concave-convex section on the surface of the substrate in the emission wavelength of LED. Second, in the reduced projection apparatus used for exposure, when the wavelength is in the range of 365 nm to 436 nm, the diameter of the dotted convex section that can be processed with respect to the resist film is as large as, or greater than, 0.5 μm. Third, when the diameter of the dotted convex section to be processed with respect to the substrate is as large as, or greater than, 10 μm, the process can also be performed using a one-to-one projection apparatus (one-shot exposure apparatus) in addition to the reduced projection apparatus. In that case, the problem of the present invention, i.e., the problem of the development pattern being deformed due to excessive exposure at the portion, in which exposure regions are adjacent to each other, by repeated exposure to the resist film, will not occur.

Thus, the exposure light irradiated onto the adjacent exposure region, upon repetitive exposure by moving a sapphire substrate with the resist film formed thereon with respect to the transfer mask, influences on the light shielding section corresponding dotted region in the resist film, corresponding to the dotted light shielding section 104 described above. As a result, the exposure amount will be more than that in the light shielding section corresponding dotted region in the resist film, corresponding to the dotted light shielding section 103.

For this reason, the shape of the dotted light shielding section 104 is corrected in accordance with the distribution of the exposure amount in the light shielding section corresponding dotted region in the resist film, corresponding to the dotted light shielding section 104. The dotted light shielding section 104 is corrected such that the cross-sectional shape and planar shape of the light shielding section corresponding dotted region in the resist film, corresponding to the dotted light shielding section 104, will be the same as the cross-sectional shape and planar shape of the light shielding section corresponding dotted region in the resist film, corresponding to the dotted light shielding section 103. Specifically, the dotted light shielding section 104 has a shape in which the planar shape is extended in the direction indicated by the arrow with respect to the dotted light shielding section 103.

Figure 4:
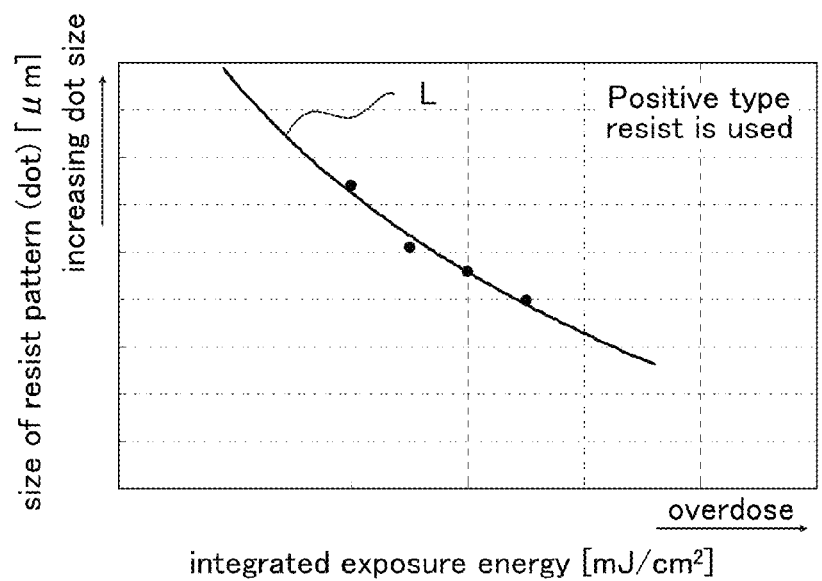
FIG. 4 is a graph for describing a light shielding pattern of an exposure mask (transfer mask) used in a method for manufacturing a semiconductor base material according to Embodiment 1 of the present invention, showing a relationship between a size of a light shielding section corresponding to a dotted region of a resist film, corresponding to a dotted light shielding section in a transfer mask, and an exposure amount in this region.
Figure 5:
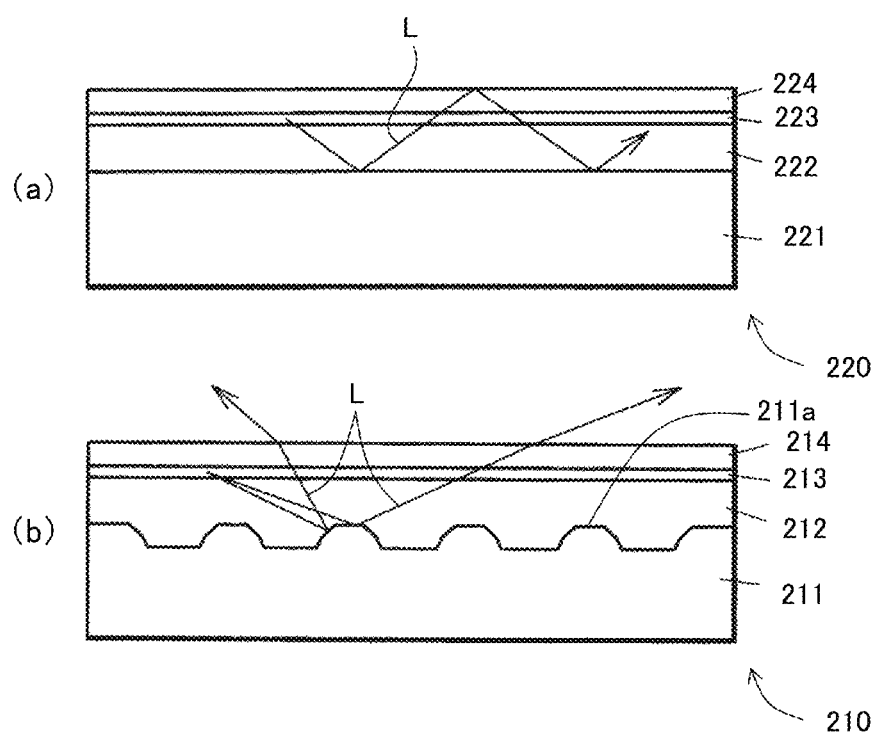
FIG. 5 is a diagram for describing an external quantum efficiency (efficiency to take light generated at a light-emitting element out of the element) of a conventional light-emitting element, the diagram also showing a light propagation path in a conventional, typical light-emitting element (FIG. 5 (a)) and in a conventional, improved light-emitting element (FIG. 5 (b)).
Figure 6:
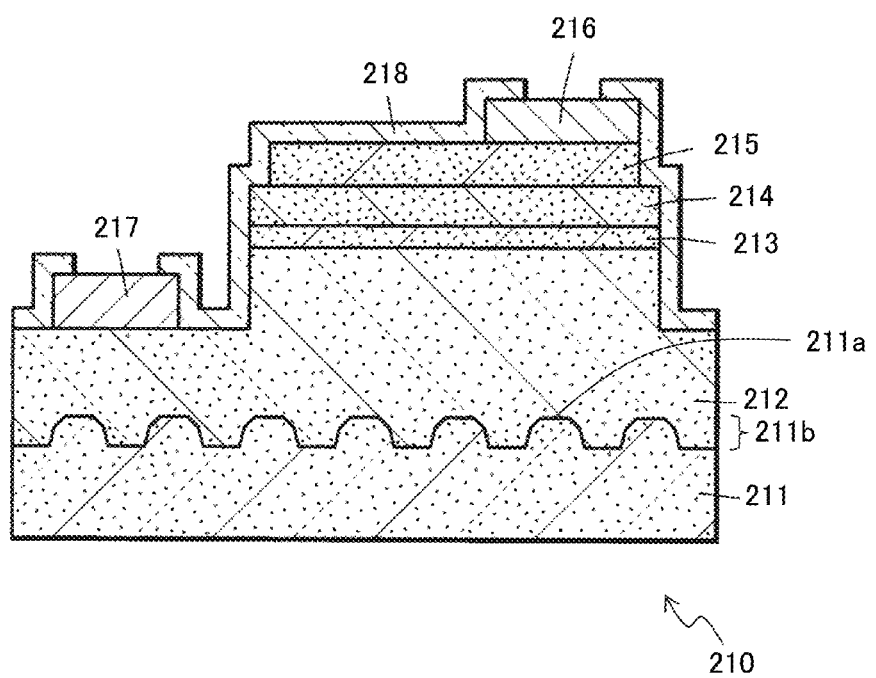
FIG. 6 is a diagram for describing a semiconductor light-emitting element disclosed in Patent Document 1, showing a cross-sectional view of the semiconductor light-emitting element having a substrate with a concave-convex shape formed on a front surface thereof.
Figure 7:
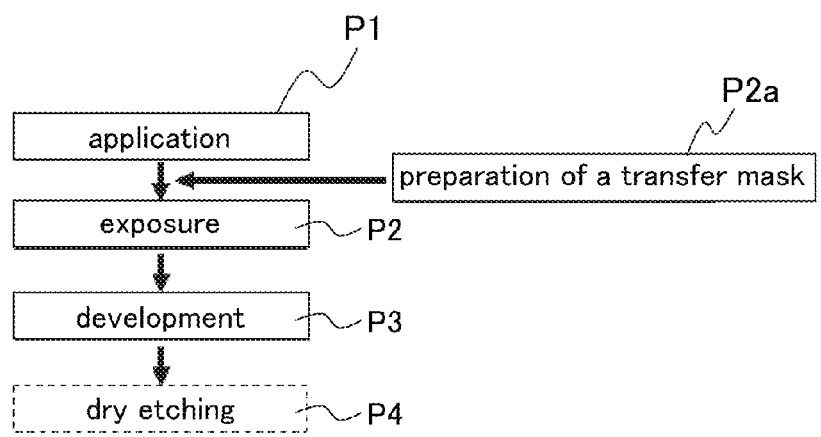
FIG. 7 is a chart for describing prior art, showing a flow of a photolithography process for forming a concave-convex resist pattern on a sapphire substrate of a light-emitting element (LED).
Figure 8:
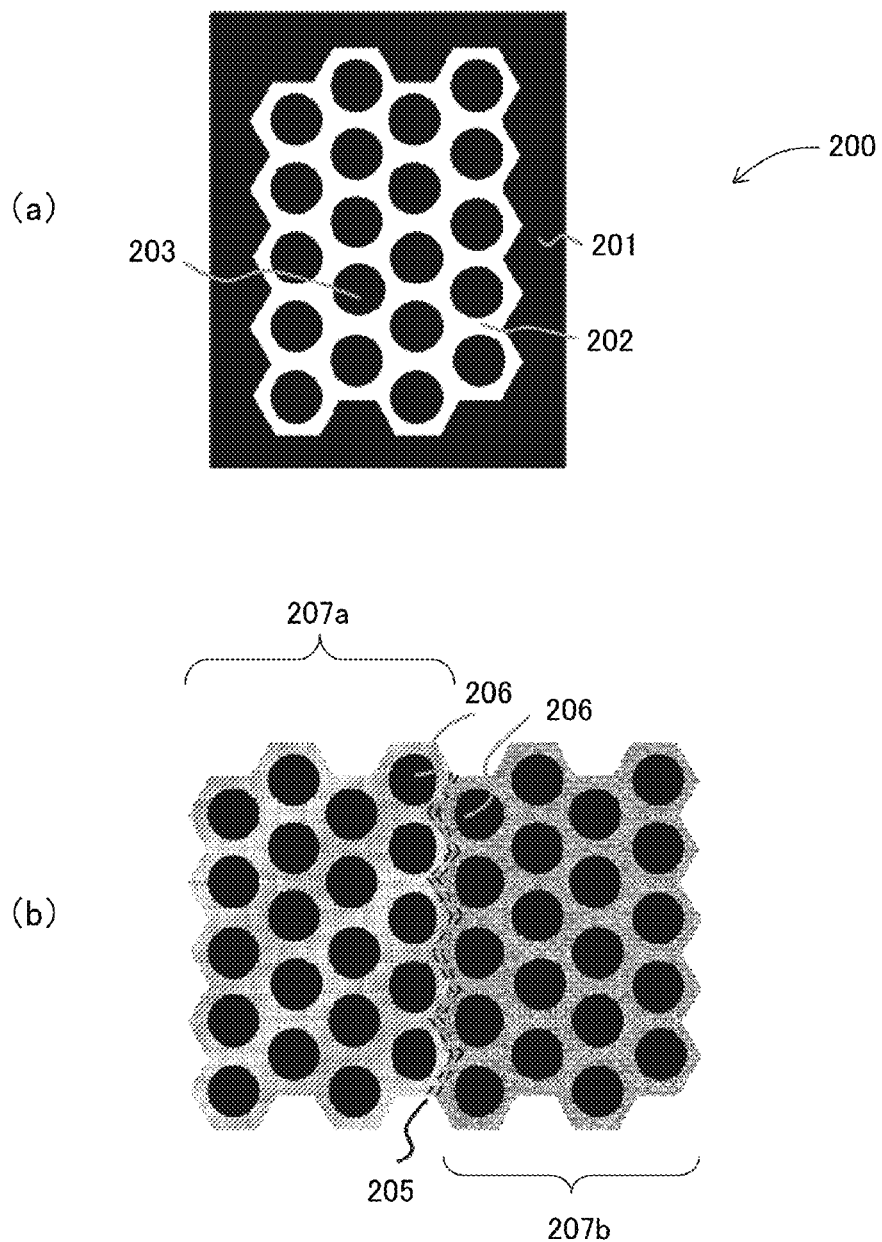
FIG. 8 is a diagram for describing an exposure process in the photolithography process shown in FIG. 7.
Figure 9:
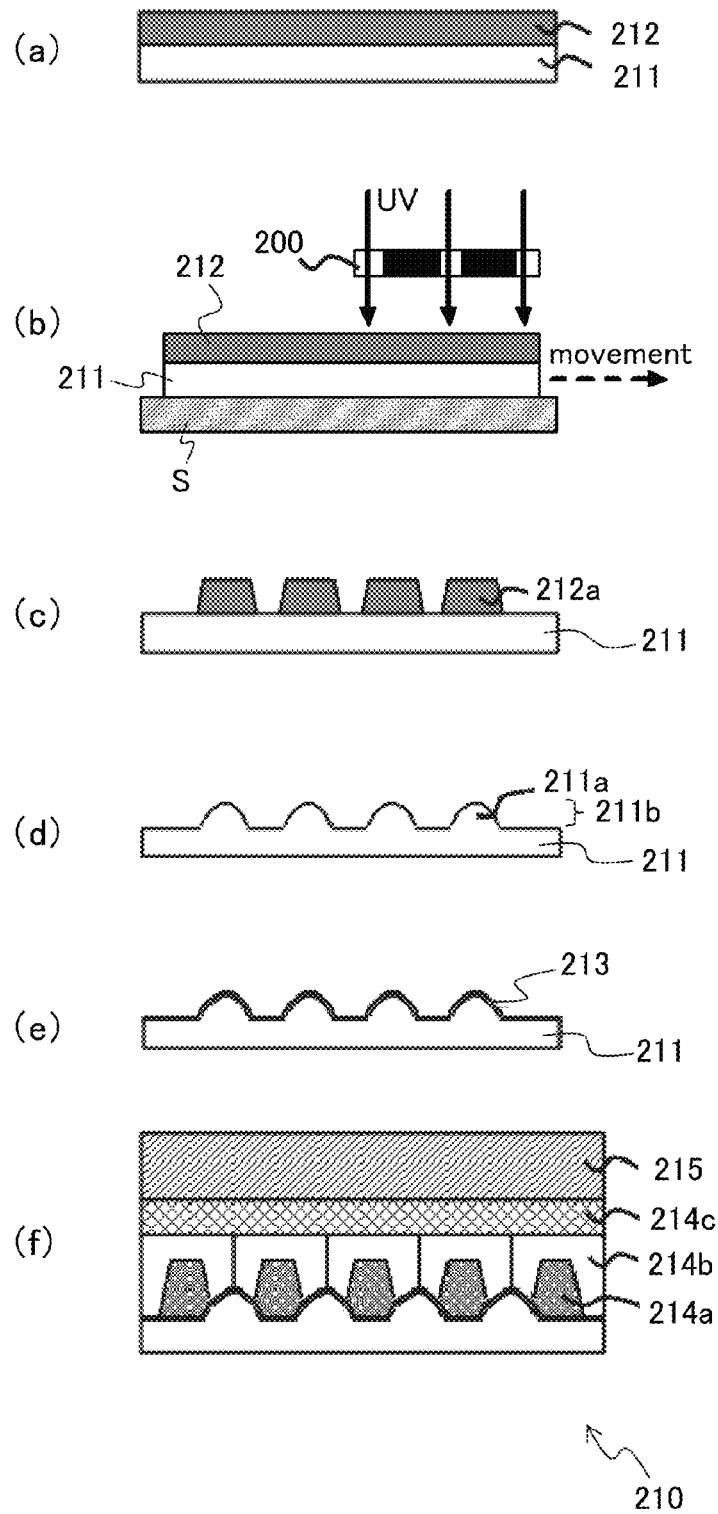
FIG. 9 is a cross sectional view for showing a process to form a semiconductor light-emitting element (LED) template, as a semiconductor base material including a sapphire substrate, using a conventional method for manufacturing a semiconductor base material in the order of the steps (FIGS. 9(a) to 9(f)).

This is due to the tendency that the size (e.g., diameter) [μm] of the light shielding section corresponding dotted region in the resist film, corresponding to a dotted light shielding section of a predetermined size in the transfer mask, becomes smaller as the exposure amount (integrated exposure energy [mJ/cm$^2$]) in the light shielding section corresponding dotted region of the resist film increases as shown in the graph L of FIG. 4.

Specifically, a transfer mask in which the dotted light shielding sections 104 near the region where exposure shots overlap (multiple exposure section) are extended in the direction shown by the arrows (outward direction of the transfer mask) compared to the dotted light shielding section 103, positioned away from the region where exposure shots overlap (multiple exposure section), is used similar to the transfer mask 100 shown in FIG. 2. The use of the transfer mask prevents the resist pattern film from being thinned due to excessive exposure energy by multiple exposure, and also allows a desired resist pattern size to be obtained after photolithography processing.

Thus, in the present Embodiment, the correction amount for correcting the size of the light shielding pattern of the transfer mask is determined by calculating the size of the resist pattern after the photolithography processing corresponding to the light shielding pattern, with the integrated dose energy (integrated exposure energy [mJ/cm$^2$]) of exposure light in the multiple exposure section as a parameter.

Next, a method for manufacturing a semiconductor base material will be described hereinafter.

Figure 3:
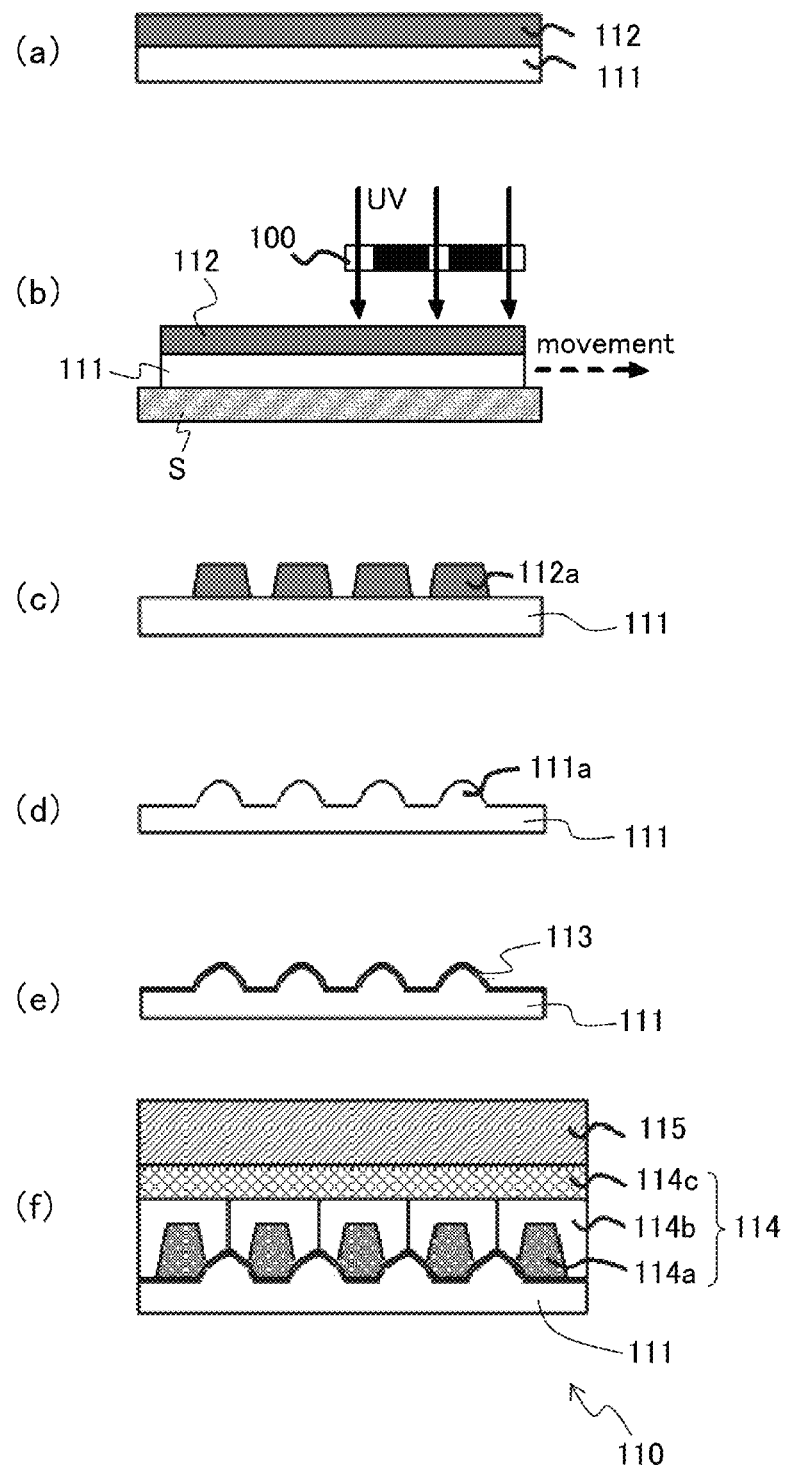
FIG. 3 is a cross sectional view for showing a process of manufacturing a semiconductor light-emitting element (LED) template, as a semiconductor base material, using the method for manufacturing a semiconductor base material according to Embodiment 1 of the present invention, in the order of the steps (FIG. 3 (a) to FIG. 3 (f)).

FIG. 3 is a cross sectional view for showing a process of manufacturing a semiconductor light-emitting element (LED) template, as a semiconductor base material, using the method for manufacturing a semiconductor base material according to Embodiment 1 of the present invention, in the order of the steps (FIG. 3 (a) to FIG. 3 (f)).

First, as shown in FIG. 3 (a), a positive type photoresist is applied to the entire surface of the sapphire substrate 111 by means of dispensing, laminating or the like, to form a resist film 112. At this stage, a photosensitizing agent, resin, organic solvent and the like are contained in the resist, and the resist film 112 is formed to have a film thickness of about 0.5 μm to 30 μm.

Next, the resist film 112 is repeatedly exposed with light (UV light) of the wavelength of about 365 nm to 436 nm throughout the entire sapphire substrate 111 as shown in FIG. 3 (b), to obtain a resist pattern of a predetermined size after the photolithography processing, by using the transfer mask 100, in which the shape of the dotted light shielding section 104 near the region where exposure shots overlap is corrected, as a transfer mask as shown in FIG. 2. Specifically, the process of reduced-projecting and transferring the exposure pattern of the transfer mask 100 to the resist film 112 of the sapphire substrate 111 by reduced exposure apparatus is repeatedly performed by successively moving the region for the reduced projection. At this stage, the movement of the regions for the reduced projection (reduced projection regions) is performed while moving a wafer stage S of the reduced exposure apparatus, on which the sapphire substrate 111 is placed, with respect to the transfer mask 100. Furthermore, the relative position of the sapphire substrate 111 with respect to the reduced exposure apparatus at the projection is determined so that the adjacent reduced projection regions will overlap a little with each other.

For the calculating of the correction amount of the planar shape in the peripheral dotted light shielding section of the transfer mask, the relationship between the size of the light shielding section corresponding dotted region of the resist film, corresponding to the dotted light shielding section of the transfer mask, and the exposure amount (integrated exposure energy) in this region is used.

Next, as shown in FIG. 3(c), the exposed resist film 112 is developed using an alkaline developer or organic solvent to form a concave-convex resist pattern corresponding to the pattern of the concave-convex section that is to be formed on the surface of the semiconductor base material.

The size of the convex section 112a, corresponding to the dotted light shielding section of the transfer mask, and being formed on the resist film 112, is about 0.5 to 10 μm in diameter.

The planar shape of the convex section 112a, corresponding to the light shielding section of the transfer mask, and being formed on the resist film 112, may also be a striped shape, in addition to the dotted shape. In this case, the convex section 112a, corresponding to the striped-shaped light shielding pattern of the transfer mask, is formed to be a striped shape having a width of about 0.5 μm to 10 μm. In this case, the corrected, striped light shielding pattern in the transfer mask (planar pattern of the striped light shielding section) is positioned in the peripheral part of the transfer mask, and its shape is such that the planar belt-like shape with a stripe width of about 0.5 μm to 10 μm is extended toward the outside of the transfer mask similar to the circular, corrected light shielding pattern as shown in FIG. 2. The width (about 0.5 μm to 10 μm) of the striped light shielding pattern is also determined based on the similar points with regard to the diameter (from 0.5 μm to 10 μm) of the above-mentioned circular light shielding section (dotted light shielding pattern).

Next, as shown in FIG. 3(d), sapphire substrate 111 is dry etched by RIE, with the resist film having a concave-convex resist pattern as a mask, to form a concave-convex section corresponding to the concave-convex resist pattern of the resist film, on the surface of the sapphire substrate 111. The concave-convex section is formed by a plurality of convex sections 111a formed on the surface of the substrate.

Next, as shown in FIG. 3(e), the AlN film 113 is formed by sputtering, as a buffer layer, on the sapphire substrate 111 having a concave-convex section formed on the surface thereof.

Furthermore, as shown in FIG. 3(f), undoped GaN layers 114a to 114c are grown by MOCVD apparatus, and an n-type GaN layer 115 is further grown, to complete an LED template 110.

At this stage, the lower undoped GaN layer 114a is formed by selective epitaxial growth in a concave section of the surface of the substrate. The middle, undoped GaN layer 114b is formed by selective and lateral epitaxial growth from the side surface of the lower, undoped GaN layer 114a, on the lower undoped GaN layer 114a the convex section of the substrate, in such a manner to bury the lower, undoped GaN layer 114*a*. The upper, undoped GaN layer 114*c* is formed on the middle, undoped GaN layer 114*b* by epitaxial growth. As such, when semiconductor layers are grown on a sapphire substrate having a concave-convex section formed thereon, the GaN layers are grown at three separate stages, so that the semiconductor layer formed as the upper side layer can be controlled not to inherit crystal defects or the like from the base thereunder.

In the method for manufacturing a semiconductor base material according to Embodiment 1 as described above, as the transfer mask, such a transfer mask is used in which the size of the light shielding pattern corresponding to the vicinity of the region where exposure shots overlap is corrected beforehand. As a result, it becomes possible to prevent the resist pattern film from being thinned due to excessive exposure energy due to multiple exposure, and resist processing with few size variation becomes possible.

For example, under the conditions of a resist applying thickness of 2.0 μm, a reduced projection type exposure apparatus with a wavelength of 365 nm, and a dot diameter of 1.5 μm, the variation in size after photolithography processing can be lowered to 50% or less than the variation in the prior art, by performing a several % to approximately ten % size correction beforehand on the pattern of the light shielding film of the transfer mask.

Furthermore, in Embodiment 1, the light shielding pattern of the exposure mask is simply adjusted so that a mask pattern of a resist mask after development will have a predetermined pattern, based on the increasing amount of exposure due to multiple exposure near the boarder of adjacent exposure regions on the substrate. Thus, the present invention is capable of obtaining an effect of reducing the manufacture cost without adding any additional processes to a photolithography process or to a dry etching process.

Although not particularly described in the above-mentioned Embodiment, the light-emitting diode using the semiconductor base material according to Embodiment 1 can be used as a light source of lighting equipment, or as a back light of a liquid crystal display apparatus. Furthermore, a semiconductor apparatus using a semiconductor base material with a surface of a substrate processed in a concave-convex shape, similar to the semiconductor base material described above, can be equipped in a variety of electrical devices.

As described above, the present invention is exemplified by the use of its preferred Embodiment. However, the present invention should not be interpreted solely based on the Embodiment described above. It is understood that the scope of the present invention should be interpreted solely based on the claims. It is also understood that those skilled in the art can implement equivalent scope of technology, based on the description of the present invention and common knowledge from the description of the detailed preferred Embodiments of the present invention. Furthermore, it is understood that any patent, any patent application and any references cited in the present specification should be incorporated by reference in the present specification in the same manner as the contents are specifically described therein.

INDUSTRIAL APPLICABILITY

In the field of a method for manufacturing a semiconductor base material, a semiconductor apparatus with a semiconductor base material obtained by the method, and an electrical device equipped with the semiconductor apparatus, the present invention provides: a method for manufacturing a semiconductor base material, the method capable of preventing a development pattern from being deformed due to excessive exposure by repetitive exposure on a part where the exposure regions are adjacent to each other in the resist film, by forming an etching mask for forming a repetitive concave-convex pattern on a front surface of a substrate of a semiconductor element by exposure development of a resist film, thus manufacturing a semiconductor base material that favorably allows a semiconductor layer to grow, as a semiconductor base material with concave-convex sections repeatedly formed on a surface thereof; a semiconductor apparatus with a semiconductor base material obtained by the method; and an electrical device equipped with the semiconductor apparatus.

REFERENCE SIGNS LIST

100 transfer mask (exposure mask)
101 peripheral light shielding section
102 light transmissive section
103, 104 dotted light shielding section
111 sapphire substrate
111*a* convex section
111*b* concave-convex section
112 positive type photoresist
112*a* resist convex section
113 AlN (buffer layer)
114*a* to 114*c* undoped GaN layer
115 n-type GaN layer
205 linking portion of exposure shots (multiple exposure region)
206 light shielding section corresponding dotted region (poor formation section)
207*a*, 207*b* exposure shot (exposure region)

The invention claimed is:

1. A method for manufacturing a semiconductor base material by processing a substrate so that a surface of the substrate has a concave-convex structure, and epitaxially growing a semiconductor layer above the substrate so that the concave-convex structure is buried, the method comprising:
   a step of forming a resist mask on the surface of the substrate by a photolithography process; and
   a step of selectively etching the substrate using the resist mask to form the concave-convex structure on the surface of the substrate,
   wherein the step of forming the resist mask comprises an exposure step of repeatedly performing a process of transferring an exposure pattern formed on a transfer mask, onto a resist film formed on the substrate, for each exposure region corresponding to the transfer mask, and
   wherein the transfer mask is obtained by correcting the size of a light shielding pattern positioned in a corresponding manner near a multiple exposure section where the exposure of light to adjacent exposure regions overlap with each other on the resist film, based on an increase in an exposure amount due to multiple exposure.

2. A method for manufacturing a semiconductor base material according to claim 1, wherein the step of epitaxially growing the semiconductor layer on the substrate comprises a step of selectively growing a semiconductor layer on the substrate in a lateral direction so that the concave-convex structure of the substrate is buried.

3. A method for manufacturing a semiconductor base material according to claim 1, wherein the process of etching the substrate is a dry etching process.

4. A method for manufacturing a semiconductor base material according to claim 1, wherein the resist film formed on the substrate is formed by applying a positive type photoresist to the substrate.

5. A method for manufacturing a semiconductor base material according to claim 1, wherein the exposure is UV exposure.

6. A method for manufacturing a semiconductor base material according to claim 1, wherein a reduced projection type exposure apparatus, equipped with a step and repeat function in a stage on which the substrate is placed, is used for the UV exposure, and the step and repeat function is to move the substrate placed on the stage by a distance corresponding to each exposure region to transfer a light shielding pattern of the transfer mask to each exposure region.

7. A method for manufacturing a semiconductor base material according to claim 1, wherein a correction amount for correcting the size of the light shielding pattern is determined by calculating the size of a resist pattern corresponding to the light shielding pattern, after the photolithography processing, and with an integrated dose energy of exposure light in the multiple exposure section as a parameter.

8. A method for manufacturing a semiconductor base material according to claim 7,
wherein the transfer mask comprises a transparent substrate and a light shielding film having a predetermined open pattern, the light shielding film being formed on the transparent substrate, and
wherein the light shielding pattern is a planar pattern of the light shielding film.

9. A method for manufacturing a semiconductor base material according to claim 8, wherein the light shielding pattern of the light shielding film formed on the transfer mask is a dotted light shielding pattern.

10. A method for manufacturing a semiconductor base material according to claim 9,
wherein the dotted light shielding pattern corresponding to an uncorrected light shielding pattern on the transfer mask, has a planar and circular shape of a diameter ranging from 0.5 μm to 10 μm, and
wherein the dotted light shielding pattern corresponding to a corrected light shielding pattern on the transfer mask, is positioned at a peripheral portion of the transfer mask, and has a shape in which the planar and circular shape of the diameter ranging from 0.5 μm to 10 μm is extended toward the outside the transfer mask.

11. A method for manufacturing a semiconductor base material according to claim 7, wherein the light shielding pattern of the light shielding film formed on the transfer mask is a striped light shielding pattern.

12. A method for manufacturing a semiconductor base material according to claim 11,
wherein the striped light shielding pattern corresponding to an uncorrected light shielding pattern on the transfer mask, has a planar belt-like shape with a stripe width ranging from 0.5 μm to 10 μm, and
wherein the striped light shielding pattern corresponding to a corrected light shielding pattern on the transfer mask, is positioned at a peripheral portion of the transfer mask, and has a shape in which the planar belt-like shape with a stripe width ranging from 0.5 μm to 10 μm is extended toward the outside of the transfer mask.

* * * * *